United States Patent [19]

Ueda et al.

[11] Patent Number: 4,990,909
[45] Date of Patent: Feb. 5, 1991

[54] REVOLUTION COUNTER USING A MAGNETIC BUBBLE DEVICE FOR MULTI-TURN ABSOLUTE ENCODER

[75] Inventors: Toshitugu Ueda; Fusao Kohsaka; Toshi Iino; Kunio Kazami; Hiroshi Nakayama; Yoshiaki Kudou; Yasuhiro Sakamaki, all of Tokyo, Japan

[73] Assignee: Yokogawa Electric Corporation, Tokyo, Japan

[21] Appl. No.: 410,359

[22] Filed: Sep. 21, 1989

[30] Foreign Application Priority Data

| Sep. 30, 1988 [JP] | Japan | 63-247877 |
| Jun. 30, 1989 [JP] | Japan | 1-168341 |
| Jul. 6, 1989 [JP] | Japan | 1-79739[U] |
| Jul. 20, 1989 [JP] | Japan | 1-85259[U] |
| Jul. 25, 1989 [JP] | Japan | 1-87094[U] |

[51] Int. Cl.⁵ ............................................. H03M 1/22
[52] U.S. Cl. ..................................... 341/15; 341/13; 250/231.14; 250/231.17; 250/231.18; 250/231.13
[58] Field of Search ............... 324/207.26, 207.13; 341/13, 15; 250/231.13, 231.14, 231.17, 231.18; 365/4, 6

[56] References Cited

U.S. PATENT DOCUMENTS

| 3,689,902 | 9/1972 | Chang et al. | 365/4 |
| 3,757,314 | 9/1973 | Homma et al. | 365/4 |
| 3,798,607 | 3/1974 | Minnick et al. | 365/4 X |
| 3,803,591 | 4/1974 | Watanabe et al. | 365/4 X |
| 4,189,674 | 2/1980 | Lathlaen | 324/207.13 |
| 4,415,856 | 11/1983 | Wells | 324/207.25 |
| 4,465,928 | 8/1984 | Breslow | 341/13 X |
| 4,646,088 | 2/1987 | Inoue | 324/207.25 X |
| 4,700,062 | 10/1987 | Ernst | 250/231.18 |
| 4,746,791 | 5/1988 | Forkel | 324/207.13 X |
| 4,746,859 | 5/1988 | Malik | 324/207.25 X |
| 4,785,242 | 11/1988 | Vaidya et al. | 324/207.25 |
| 4,791,366 | 12/1988 | Suzuki et al. | 324/207.25 |
| 4,855,734 | 8/1989 | Elsdoerfer | 324/207.25 X |

Primary Examiner—William M. Shoop, Jr.
Assistant Examiner—Randy Gibson
Attorney, Agent, or Firm—Moonray Kojima

[57] ABSTRACT

A multi-turn absolute encoder comprising a shaft angle encoder for measuring the turning angle of a rotating shaft, and a turn detector for detecting the number of turns of the rotating shaft, wherein the turn detector uses a magnetic bubble element for sequentially transferring magnetic bubbles in a pattern in accordance with a magnetic field generated by a permanent magnet turned by the shaft, and a detector to detect the number of turns of the shaft from the positions of the magnetic bubbles which are transferred in the pattern.

11 Claims, 17 Drawing Sheets

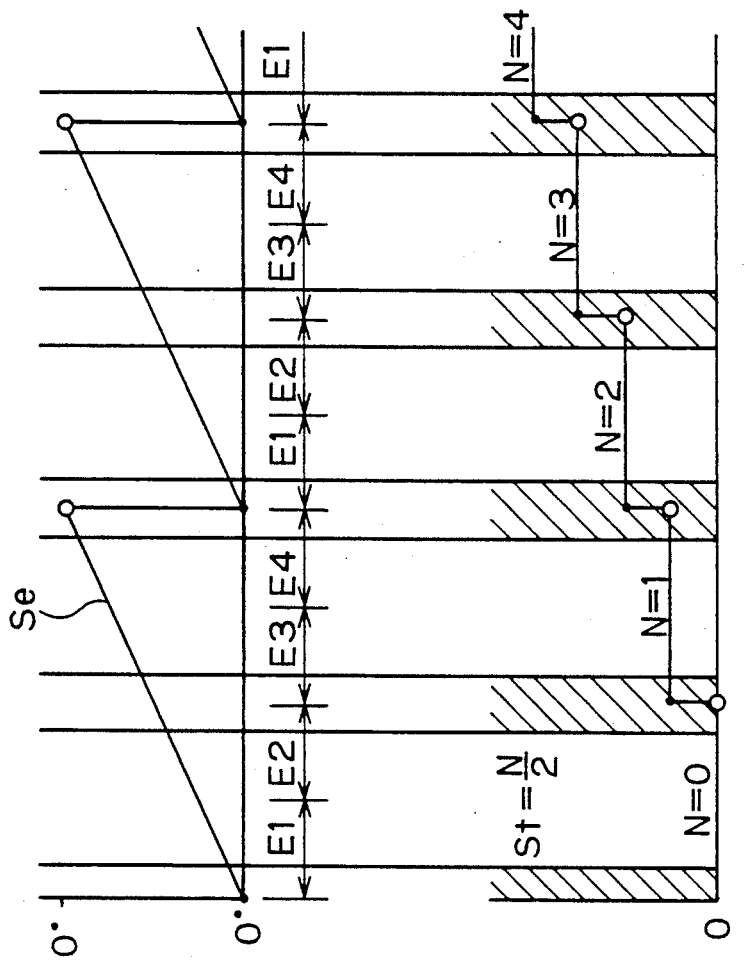
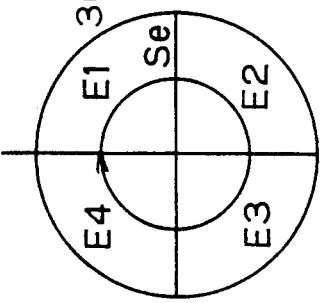
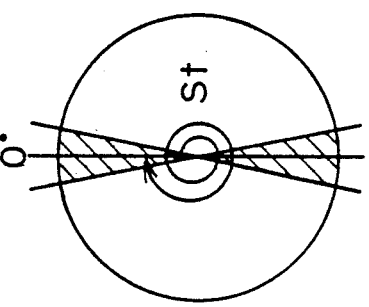

```
  0 1 1
  1 1 1
  1 1 0
↓ 1 0 1
  0 1 0
  1 0 0
  0 0 0
  0 0 1
```

| The Number of Revolutions | Bit Pattern | | |
|---|---|---|---|
| 0 | 0 0 1 | 0 1 0 0 | 4 |
| 1 | 0 1 0 | 1 0 0 0 | 8 |
| 2 | 1 0 1 | 0 0 0 0 | 0 |
| 3 | 0 1 0 | 0 0 0 1 | 1 |
| 4 | 1 0 0 | 0 0 1 0 | 2 |
| 5 | 0 0 0 | 0 1 0 1 | 5 ←Illustrated State |
| 6 | 0 0 0 | 1 0 1 0 | 10 |

↑ P21 Sensor Position

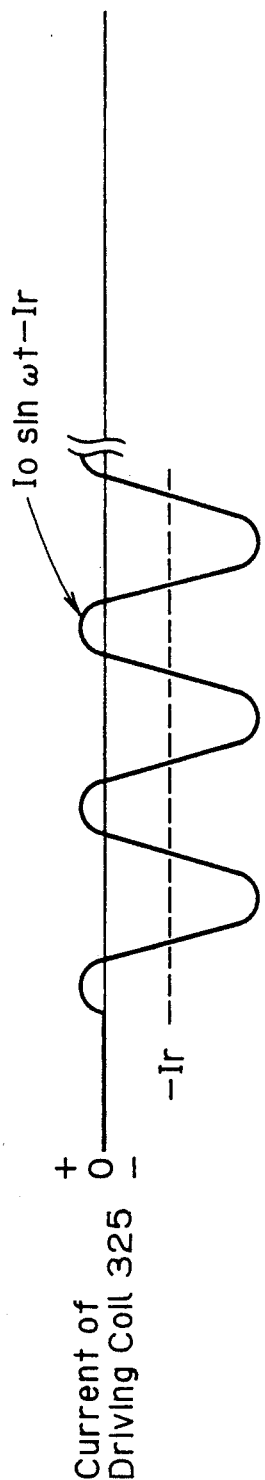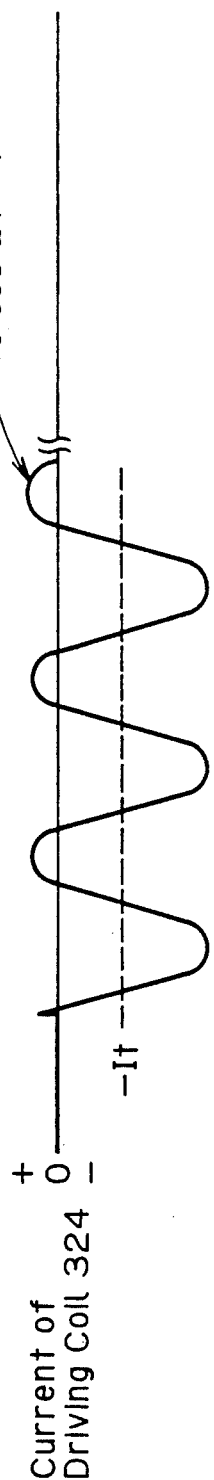

REVOLUTION COUNTER USING A MAGNETIC BUBBLE DEVICE FOR MULTI-TURN ABSOLUTE ENCODER

BACKGROUND OF THE INVENTION

1. Field of the Invention

This invention relates to a multi-turn absolute encoder capable of measuring the turning angles of one or more turns, for example, of a rotating shaft; and more particularly, to such an encoder which is capable of operating even when power is cut off and which is capable of invariably obtaining absolute measurement outputs.

2. Description of the Prior Art

A typical prior art multi-turn absolute encoder uses a speed reduction gear mounted on a rotary shaft with the turning angle being measured by an absolute encoder or a potentiometer after deceleration has been effected.

However, there are some drawbacks to this type of multi-turn absolute encoder. For example, the device undergoes backlash influences, or the like, because mechanical rotation propagating units, such as the speed reduction gear, are provided. This in turn makes highly accurate measurement highly unlikely. Also, this necessitates use of an intricate and complicated structure. As a result, reliability is decreased.

SUMMARY OF THE INVENTION

An object of the invention is to provide a simply constructed multi-turn absolute encoder which is capable of operating even when power is cut off, and which is capable of measuring turning angle of one or less turn , e.g. of a rotating shaft, with high accuracy, and which is capable of measuring the number of turns also with high accuracy.

The foregoing and other objects are attained by the invention which encompasses a multi-turn absolute encoder comprising an absolute encoder for measuring a turning or rotational angle of one or less turns of a rotating shaft, for example, and cooperatively combined therewith a turn detector for detecting the number of turns of the shaft, for example. The turn detector comprises a magnetic bubble element for sequentially transferring magnetic bubbles in accordance with rotations of a driving magnetic field, and a permanent magnet which turns together with a code plate of the absolute encoder and which generates the driving magnetic field which drives the bubble element. The number of turns, e.g. of the rotary shaft, and/or of the shaft angle encoder is detected from observing the positions of the magnetic bubbles on a transfer pattern in the magnetic bubble element.

BRIEF DESCRIPTION OF THE DRAWINGS

FIGS. 3(A), 3(B) and 3(C), and 4(A), 4(B) and 4(C) are diagrams used to explain the obtaining of a turning angle of the rotary shaft from the output from the shaft angle encoder and the output from the turn detector.

FIG. 10, comprising lines (A),(B) and (C), is a waveform chart depicting operation of the circuit of FIG. 9.

DETAILED DESCRIPTION OF THE PREFERRED EMBODIMENTS

Figure 1:
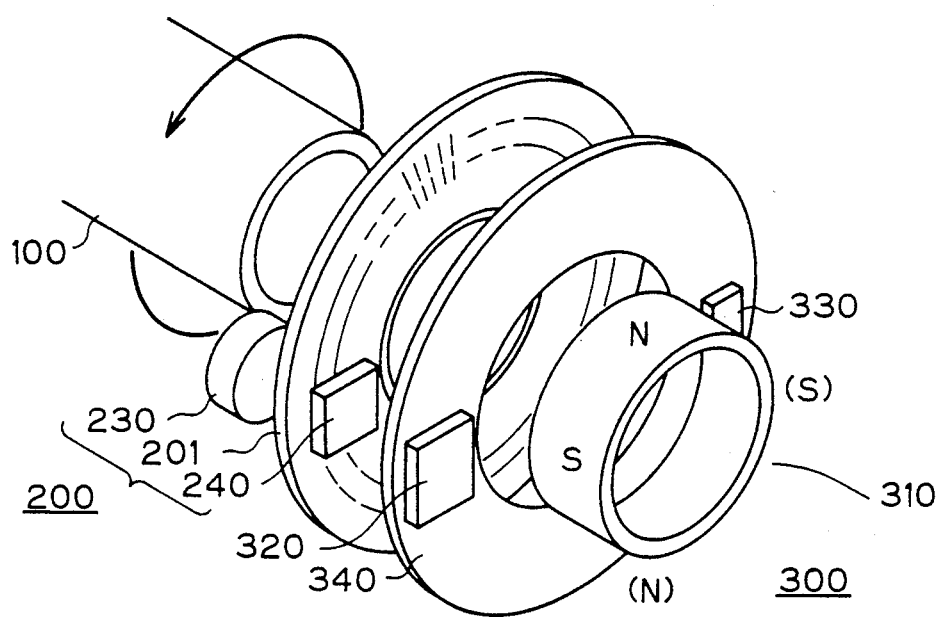
FIG. 1 is a block diagram depicting conceptually an illustrative embodiment of the invention.

FIG. 1 shows conceptually the inventive multi-turn absolute encoder comprising a rotary shaft 100 whose turning angle is to be measured; and a shaft angle encoder 200 for measuring the turning angle (that is the rotational angle) of one or less turns of the rotary shaft 100 with high accuracy. The absolute encoder 200 comprises a code plate 201 fitted to rotary shaft 100; a light source 230; and a photosensor 240 for detecting beams of light travelling through a plurality of trains or series of slits formed in code plate 201. Code plate 201 is incised or cut with two trains or series of slits each having a different pitch. The term "pitch" means the distance measured between the same part of two adjacent slits such as the front edge of adjacent slits. Thus, for example, one train of slits would have 10 numbers of slits and the other train of slits would have 9 numbers of slits. Displacement of these slit trains are converted into phase signals, and the absolute turning or rotational angle of code plate 201 is measured by observing or detecting the phase difference between the phase signals.

The inventive apparatus also comprises a turn detector 300 for measuring the number of turns of the rotary shaft 100 and comprises a cylindrical permanent magnet 310 having its outer periphery magnetized alternately in the peripheral direction thereof and fitted annularly to rotary shaft 100; a magnetic bubble element 320; a magnetic field sensor 330 for detecting the intensity of the magnetic field applied to the magnetic bubble element; and a support substrate 340. The magnetic bubble element, and magnetic field sensor are provided on the support substrate which is disposed on the outer periphery of permanent magnet 310.

The magnetic bubble element 320 functions to sequentially transfer magnetic bubbles in accordance with each turn of the driving magnetic field. Magnetic bubble element 320 is disposed on the outer periphery of permanent magnet 310 so that a magnetic field generated by the permanent magnet 310 serves as a driving magnetic field. For this reason, when permanent magnet 310 is rotated together with shaft 100, a turning or rotating magnetic field is applied to magnetic bubble element 320, thereby transferring the magnetic bubbles in the magnetic bubble element 320. Thus, as shown in FIG. 1, when shaft 100 is turned once, the driving magnetic field makes two turns provided that the number of poles of the permanent magnet 310 is set at 4. Then, it follows that the magnetic bubbles in the magnetic bubble element 320 are moved by two steps on the transfer pattern. Thus, by detecting or observing the positions of the magnetic bubbles on the transfer pattern, the number of turns of the shaft 100 is known.

Thus, there are two detectors, one to detect the rotational angle of up to one turn of the shaft (shaft angle encoder 200) and the other to detect the number of turns of the shaft (turn detector 300). The arrangement can also detect the number of turns of the shaft angle 200.

Figure 2:
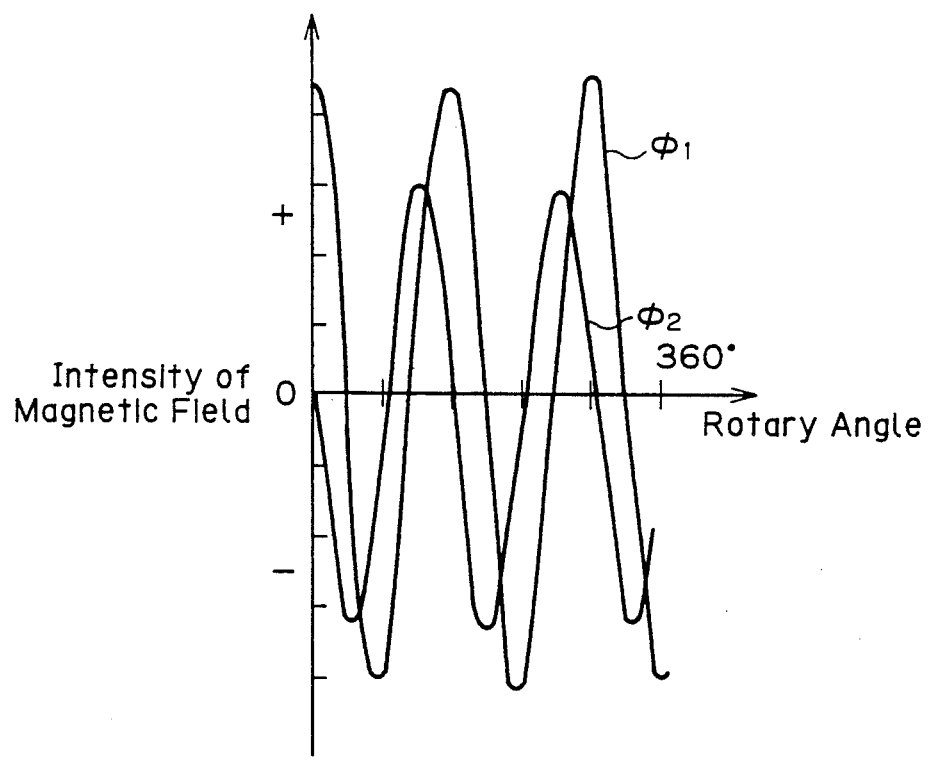
FIG. 2 is a diagram depicting application of a magnetic field to a magnetic bubble element in accordance with rotations of a rotary shaft and permanent magnet.

FIG. 2 shows a graph depicting the intensity of magnetic field applied to the magnetic bubble element 320 versus rotary angle of shaft 100 and permanent magnet 310 attached thereto, wherein line $\phi 1$ indicates a magnetic field component in a direction of the normal line of permanent magnet 310, and line $\phi 2$ indicates a magnetic field component in a direction of tangential line along the outer periphery thereof. The magnetic field applied to magnetic bubble element 320 is obtained by synthesizing these components and the magnetic field also becomes a turning magnetic field which is approximate to a round in conformity with the turns of the shaft 100.

The magnetic bubbles generated on a magnetic bubble generating pattern during the transfer pattern in magnetic bubble element 320 do not disappear when a bias magnetic field is imparted thereto by a holding permanent magnet. The magnetic bubbles are allowed to act even when the power supply is cut off, because the transfer is effected by a turn of the driving magnetic field, whereby signals corresponding to the number of turns is obtained. The turning angle of one or less turns of shaft 100 is measured by shaft angle encoder 200. At the same time, the number of turns of shaft 100, which can also be the number of turns of shaft angle encoder 200, is detected by the turn detector 300. It is therefore possible to realize a multi-turn absolute encoder which is capable of detecting the number of turns of the rotary shaft 100 even when the power supply is cut off during measurement, and which also constantly obtains absolute measurement outputs with respect to the turning angle of one or less turn.

Permanent magnet 310, which is annularly fitted to shaft 100, generates a driving magnetic field for driving magnetic bubble element 320, and the magnetic bubbles are transferred in the transfer pattern in accordance with the number of turns of the magnet. This arrangement contributes to the simplification of the construction and to the increase in reliability.

Next will be discussed, with reference to FIGS. 3(A),3(B) and 3(C), procedures for obtaining the turning angle of shaft 100 from an output signal Se of shaft angle encoder 200 and from an output signal St of turn detector 300. As shown in FIGS. 3(A) and 3(C), the output signal Se of shaft angle encoder 200 returns to 0° every time the code plate 201 makes one revolution. On the other hand, as shown in FIGS. 3(B) and 3(C), since permanent magnet 310 has 4 poles and the resolving power is ½ turn, the turn output signal St of turn detector 300 is expressed as $St = N/2$, wherein N is the detection output signal obtained from the number of transferring processes of the magnetic bubbles. Note that the portions drawn with oblique lines in FIGS. 3(B) and 3(C) indicate error regions in detection output N.

As shown in FIG. 3(C), the range of output values in shaft angle encoder 200 is divided into four segments E1–E4. Examining the values that the detection output of turn detector 300 are to take with respect to the individual output segment ranges, the results are given as follows:

| Se | E1 | E2 | E3 | E4 | E1 | E2 | E3 | E4 |
|----|----|----|----|----|----|----|----|----|
| N  | 0  | 0  | 1  | 1  | 2  | 2  | 3  | 3  |
| St | 0  | 0  | 0  | 0  | 1  | 1  | 1  | 1  |
| Se | E1 | E2 | E3 | E4 | E1 |    |    |    |
| N  | 4  | 4  | 5  | 5  | 6  | ... |   |   |
| St | 2  | 2  | 2  | 2  | 3  | ... |   |   |

As can be seen from this above table, when the measurement output Se of shaft angle encoder 200 falls within the output segmental range E1 and E2, the detection outputs N are of even numbers. On the other hand, when the output Se is included in E3 and E4, the outputs when N are of odd numbers. However, the illustrated error regions are present in the course of actual variations in the detection output N. Thus, there is the probability that the detection outputs N are of odd numbers in the output range of E1.

Under such circumstances, it is necessary to judge whether detection output N is an odd number or an even number. When the turn output signal St is, as shown in the following table, corrected according to the output ranges E1 to E4, it is feasible to obtain an accurate number of turns irrespective of detection errors of the turn detector 300.

| Output range/N | Odd Number | Even Number |
|----------------|------------|-------------|
| E1 | (N + 1)/2 | N/2 |
| E2 | (N − 1)/2 | N/2 |
| E3 | (N − 1)/2 | N/2 |
| E4 | (N − 1)/2 | (N − 2)/2 |

Figure 4C:
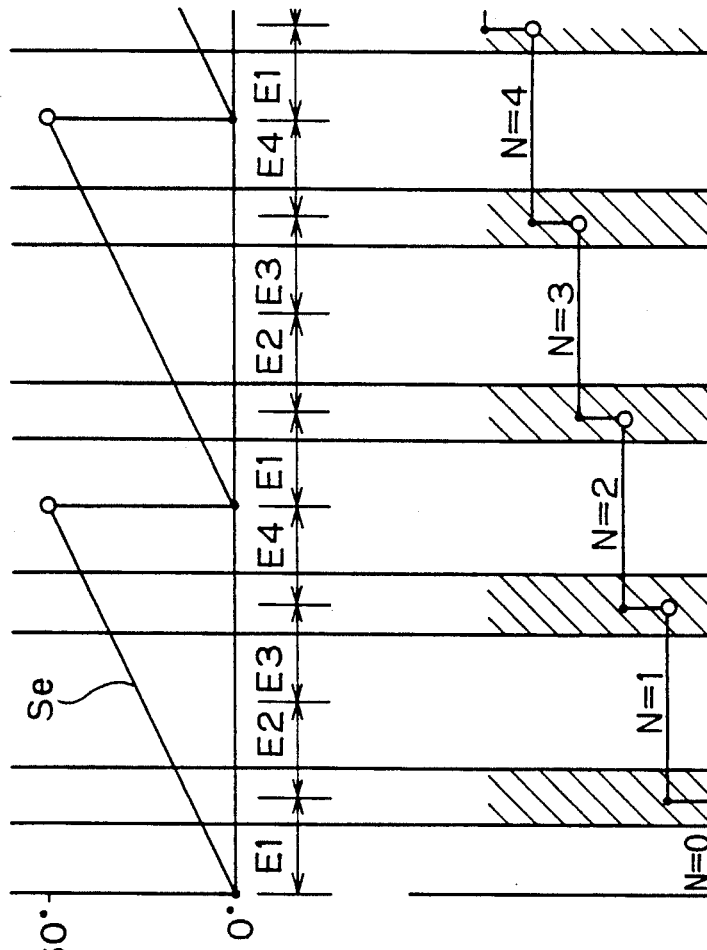
Figure 4A:
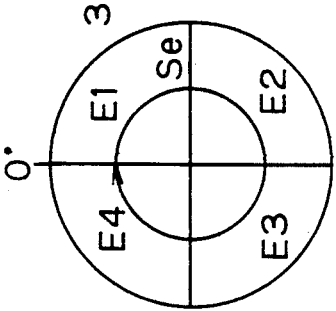
Figure 4B:
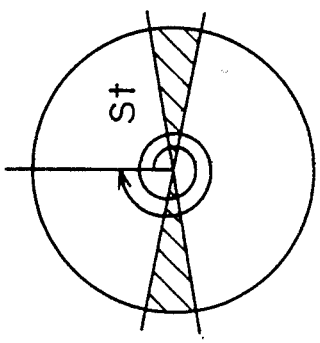

FIGS. 4(A), 4(B) show an arrangement in which the phases of shaft angle encoder 200 and of turn detector 300 are shifted, and the timing at which the detection output N is updated in the turn detector 300 advances through 90°. Based on this structure, the relation between the measurement output Se of shaft angle encoder 200 and the detection output N of the turn detector 300 is also the same.

| Output range/N | Odd number | Even Number |
|----------------|------------|-------------|
| E1 | (N − 1)/2 | N/2 |
| E2 | (N − 1)/2 | N/2 |
| E3 | (N − 1)/2 | N/2 |
| E4 | (N − 1)/2 | (N − 2)/2 |

When the turn output St is corrected in this manner, an accurate turn output St is obtained.

Figure 5:
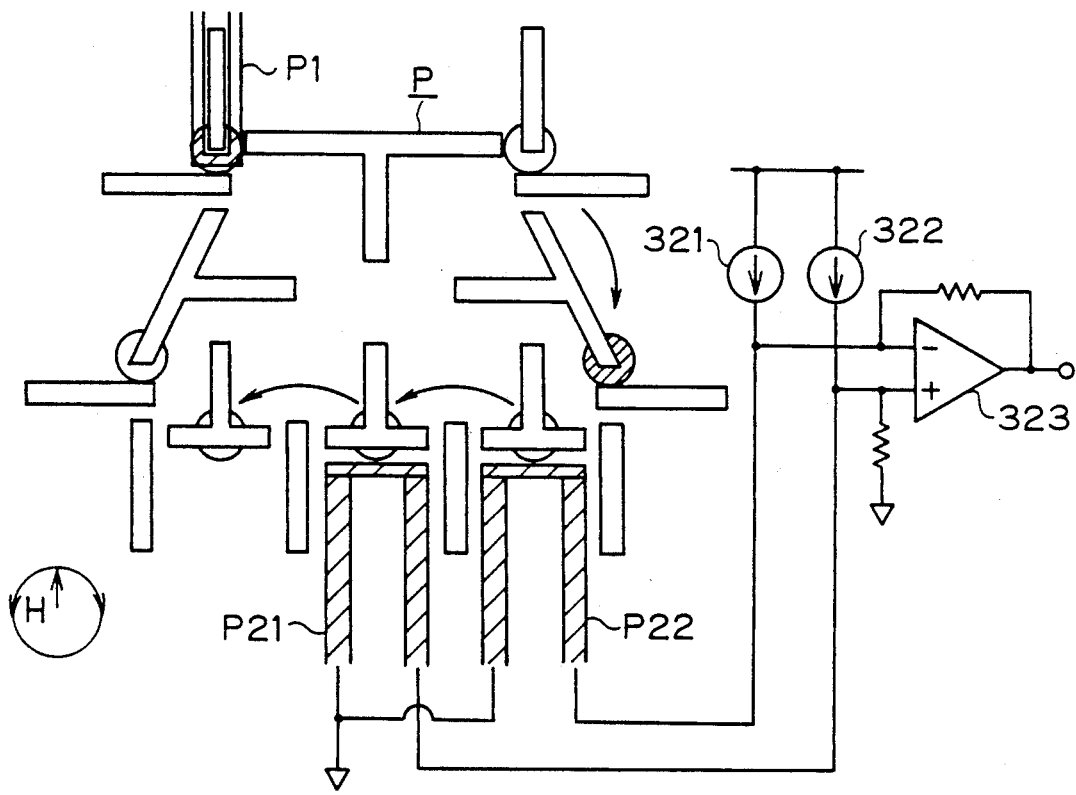
FIG. 5 is a block diagram depicting an illustrative position detecting circuit for magnetic bubbles and a transfer pattern in a magnetic bubble element.

FIG. 5 illustrates one example of a position detection circuit of the magnetic bubble and the transfer pattern in the magnetic bubble element 320. The transfer pattern is depicted in FIG. 5 shows the case where the maximum detection number of turns is 7 ($>2^2$). The symbol P represents a transfer loop. P1 represents a pattern for generating magnetic bubbles. P21 and P22 represent magnetic bubble detectors. Detector P22 is used as a dummy. Constant current sources 321 and 322 are provided for supplying constant currents to magnetic bubble detectors P21 and P22. A differential amplifier 323 is provided for obtaining a difference in output between magnetic bubble detectors P21 and P22.

Figure 6:
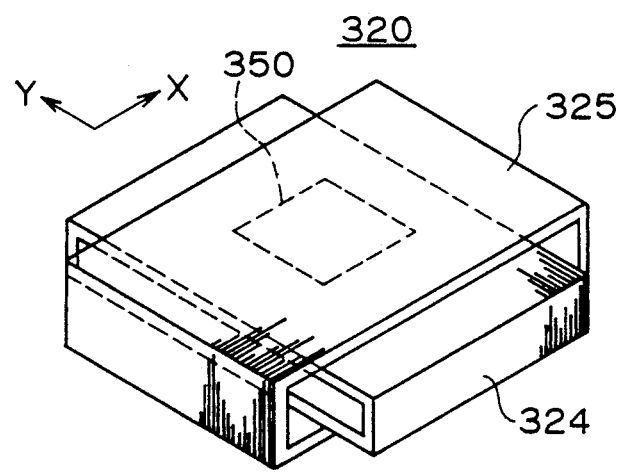
FIG. 6 is a perspective view depicting a transfer means for transferring the magnetic bubbles independently of the permanent magnet.

In FIG. 6, a magnetic bubble transfer means ( of magnetic bubble element 320) for transferring the magnetic bubbles independently of the permanent magnet, is shown comprising a substrate 350 formed with transfer loop P; a driving coil 324 for generating a magnetic field in the X-axis direction; and a driving coil 325 for generating a magnetic field in the Y-axis direction. Driving coils 324 and 325 are supplied with sine wave currents which are out of phase by 90°, thereby making it possible to generate a second turning magnetic field and transfer an arbitrary number of magnetic bubbles on transfer loop P in an arbitrary direction.

Formed on transfer loop P, which may comprise seven transfer elements, is , for example, a 7 digit bit pattern (e.g. 0010100) obtained by interposing zeroes into a 4 digit bit pattern (0110) which is determined by a theorem of a memory wheel, depending on the presence or non-presence of magnetic bubbles. The positions of the magnetic bubbles are detected by making use of time series signal outputs acquired from the outputs of differential amplifier 323 when the magnetic bubble transfer means transfers the magnetic bubbles four times ($2\times2$). After detecting the positions thereof, the magnetic bubbles are in turn transferred four times in the reverse direction by magnetic bubble transfer means, thus reverting back to their original positions.

In general, an arrangement of an $S^n$ type memory wheel is such that only $S^n$ pieces of S group symbols are disposed around a loop; and when a rotor contiguous to n symbols subsequent thereto makes one revolution, permutations in which n number of symbols are taken out of the S group symbols appear one by one.

Figures 7, 8:
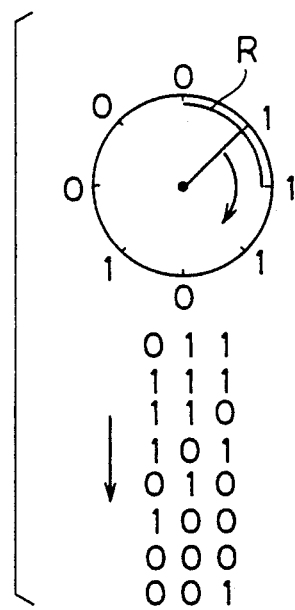
FIGS. 7 and 8 are diagrams each depicting an example of a $2^3$ type memory wheel and the state of a bit pattern on a transfer loop.

Referring to FIG. 7, there is shown one example of an $2^3$ type memory wheel. Where a binary bit pattern (0,1) is, as depicted in FIG. 7, placed, a binary 3 digit pattern signal obtained in accordance with the rotation of the rotor R takes eight different patterns according to the positions (i.e. rotational angles) of the rotor R. The rotary positions of the rotor R is distinguished on the basis of the state of this pattern signal.

The device depicted in FIG. 5 is arranged in such a way that rotor R is formed by the magnetic bubble transfer means transferring the magnetic bubbles four times when effecting the detection, and the transfer of the magnetic bubbles by the driving magnetic field of the magnet corresponds to the rotation of the rotor R. Thus, a train of pattern signals obtained in time series from the magnetic bubble detector P21 corresponds to the number of turns of the magnetic bubbles. The number of turns of the driving magnetic field (which measures the rotary shaft or the like) can be detected from the pattern signals.

FIG. 8 shows the relation between the number of turns of the driving magnetic field and the bit pattern of the transfer loop P. For example, the positions of the lower 4 digits are detected by the magnetic bubble detector P21. More specifically, as shown in FIG. 5, in the transfer state (in this case the number of turns is 5) of the magnetic bubbles, when the magnetic bubble transfer means transfers the bubbles four times clockwise in FIG. 5, an output signal train of the magnetic bubble detector P21 becomes 0101. Subsequently, the magnetic bubbles are transferred four times by the magnetic bubble transfer means in the reverse direction and return to the original positions. When the driving magnetic field further makes one turn, the pattern signal is changed to 1010, thereby exhibiting the state wherein the number of turns is 6.

As discussed above, formed on transfer loop P is a bit pattern in which zeroes are interposed in a $2^2$ type memory wheel. Seven different pattern signals, which exhibit one to one correspondence to the number of turns of the driving magnetic field, can be acquired from the magnetic bubble detector P21.

Magnetic bubble detector P22 is disposed adjacently to the magnetic detector P21 and is set substantially in the same state in terms of magnetism. Thus, equi-phase noises superposed on signal outputs of the magnetic bubble detector P21 are offset by differential arithmetic operation with respect to the outputs of the magnetic bubble detector P22 used as a dummy. As a result, it is possible to perform detection with a remarkably excellent signal to noise (S/N) ratio. In this case, a bit pattern is formed by interposing zeroes into the $2^2$ type memory wheel to prevent a 0 continuous state from being entangled with a 1 continuous state due to the differential arithmetic by eliminating the latter state.

In the embodiment given above, there has been exemplified the case where the maximum detection turn number N is 7. The number N is not, however, limited to this value of 7. That is to say, a transfer loop is constituted on the transfer pattern typically by N-pieces of transfer elements. Depending on the presence or non-presence of the magnetic bubbles, a bit pattern, obtained by interposing zeroes into a pattern of an n-th memory wheel which satisfies the relation $N>2^n \geq N/2$, is written in the transfer loop. The magnetic bubble positions are detected from a pattern of signal trains generated in the outputs of the magnetic bubble detector when the magnetic bubble transfer means has transferred the magnetic bubbles 2n times. Then, a turn detector of the maximum detection turn number N is realized simply by effecting the transferring processes 4n times.

In the embodiment, the maximum detection turn number N is 8 (which is equal to $4\times2$), and the number of transferring processes for detection is 4. If the number of transfer elements is of a larger number or value, however, a more remarkable effect can be realized. Where the number of transfer elements is, for example, 1000, the transfer may be effected 36 times (i.e. $9\times2\times2=36$), when $1000<2^9\geq1000/2$.

The foregoing embodiment has dealt with the case where the single transfer loop is used. If a plurality of transfer loops are used, however, a much greater number of turns can be detected by a small number of transfer elements. More specifically, there are formed a plurality of transfer loops in which the number of transfer elements are two or more integers $N_1, N_2 \ldots$ which have no common divisor (i.e. mutually prime) as a transfer pattern. Detection loops in which each of the integers $N_1, N_2 \ldots$ serves as the maximum detection turn numbers are constituted by using two magnetic bubble detectors and a differential amplifier means.

In the respective detection loops, there is written a bit pattern obtained by interposing zeroes into a pattern of an ni-th memory wheel which meets the relation $N_i > 2^n \geq N_i/2$, wherein i equals 1,2, . . . , depending on the presence or non-presence of magnetic bubbles. When nm is the maximum value of $n_1, n_2, \ldots$, the magnetic bubbles are transferred 2nm times by the magnetic bubble transfer means, at which time the number of turns of the rotary shaft, or the like, is detected from the combination of patterns of signal trains generated in the outputs of the differential amplifying means of each transfer loop. Where the transfer is further carried out 2nm times in the reverse direction, it is possible to realize simply a turn detector, in which the maximum detection turn number $N = (N_1 \times N_2 \times \ldots)$, by effecting the transfer nm times.

Figure 9:
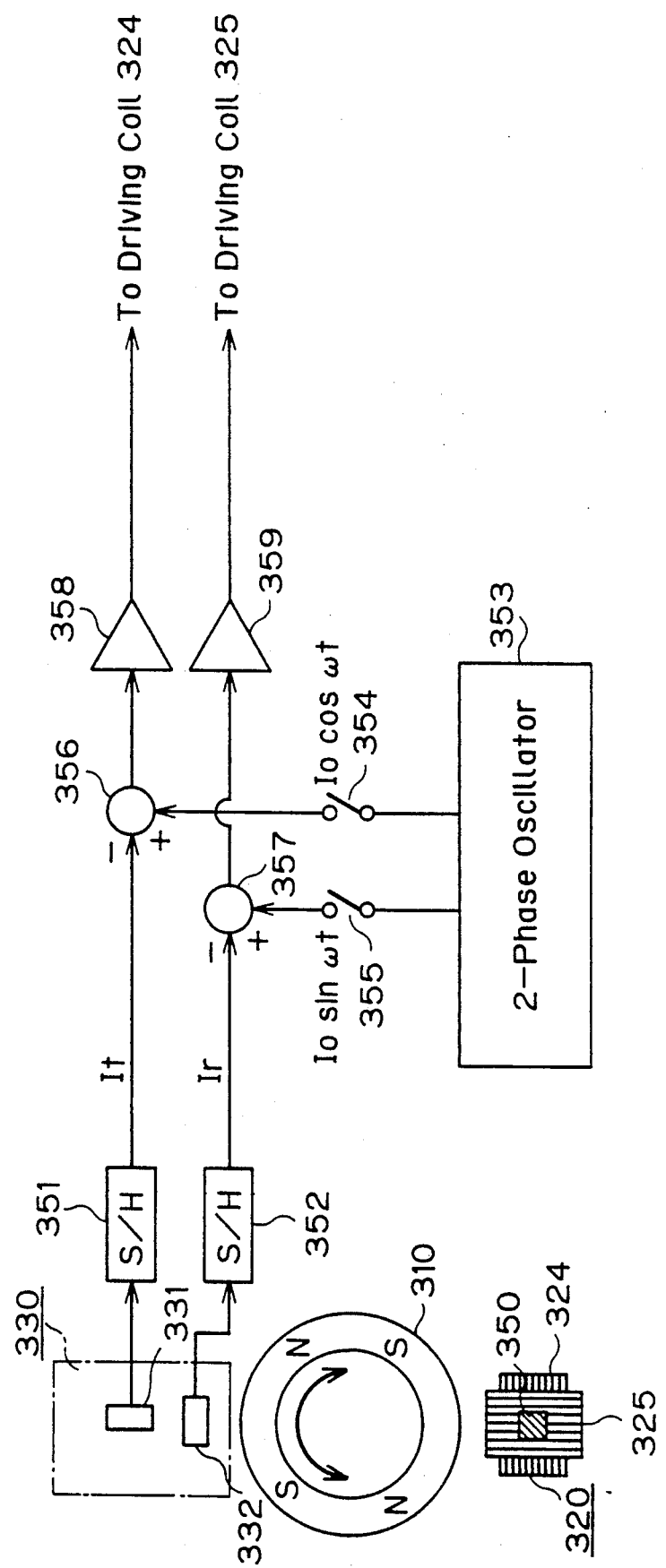
FIG. 9 is a diagram depicting a driving circuit for driving the coils.

In FIG. 9, one illustrative embodiment of a coil driving circuit for supplying the driving coils 324,325, with sine wave currents which are 90° out of phase, comprises Hall elements 331,332 disposed with a magnetic bubble element 320 to exhibit symmetry with respect to permanent magnet 310, for detecting intensities of magnetic fields in the directions of axes X and Y; sample and hold circuits 351,352 for sample and holding output signals of the Hall elements 331 and 332; a 2- phase oscillator 353 which operates to generate constant currents $I_0 \sin wt$ and $I_0 \cos wt$, which are out of phase by 90°; switches 354,355 for outputting the constant currents $I_0 \sin wt$ and $I_0 \cos wt$ for a predetermined period; subtractors 356,357 for subtracting outputs It and Ir of sample-hold circuits 351,352 from the constant currents applied through switches 354,355; and drivers 358, 359 for driving driving coils 324,325 in accordance with the outputs of subtractors 356 and 357. Frequency "w" is referred to herein as "w"

The operation of the coil driving circuit of FIG. 9 will now be discussed with reference to FIG. 10. When transferring the magnetic bubbles by use of the driving coils 324,325, sample and hold signals S/H are generated (see line (A)), at which time the respective Hall outputs are sample and held. Thereafter, the constant current $I_0 \sin w t$ and $I_0 \cos w t$, each having a predetermined period, are produced by operating switches 354,355. Subsequently, the sample held Hall outputs (currents It and Ir) are subtracted from the constant currents, and the illustrated currents (see lines (C) and (B) respectively) are supplied to the driving coils 324,325. As a result, a turning magnetic field (which is the second turning magnetic field) having a constant magnitude is obtained from driving coils 324,325 without undergoing any influence of the first turning magnetic field generated by the permanent magnet 310.

As discussed above, Hall elements 331 and 332 are disposed with the magnetic bubble element 320 to show symmetry with respect to the permanent magnet 310 so as to make it feasible to detect the intensities of the magnetic fields (i.e. the first turning magnetic field) applied to the bubble element 320 from permanent magnet 310. The currents It and Ir, which are proportional to the detected intensities, are superposed on the driving currents of driving coils 324, and 325, thereby offsetting the first turning magnetic field and at the same time obtaining the second turning magnetic field having no offset. Thus, the magnetic field applied to the magnetic bubble detectors P21 and P22 is only the second turning magnetic field, and the presence or non-presence of the magnetic bubbles can be surely detected without saturating the magnetic bubble detectors P21 and P22.

Figure 11:
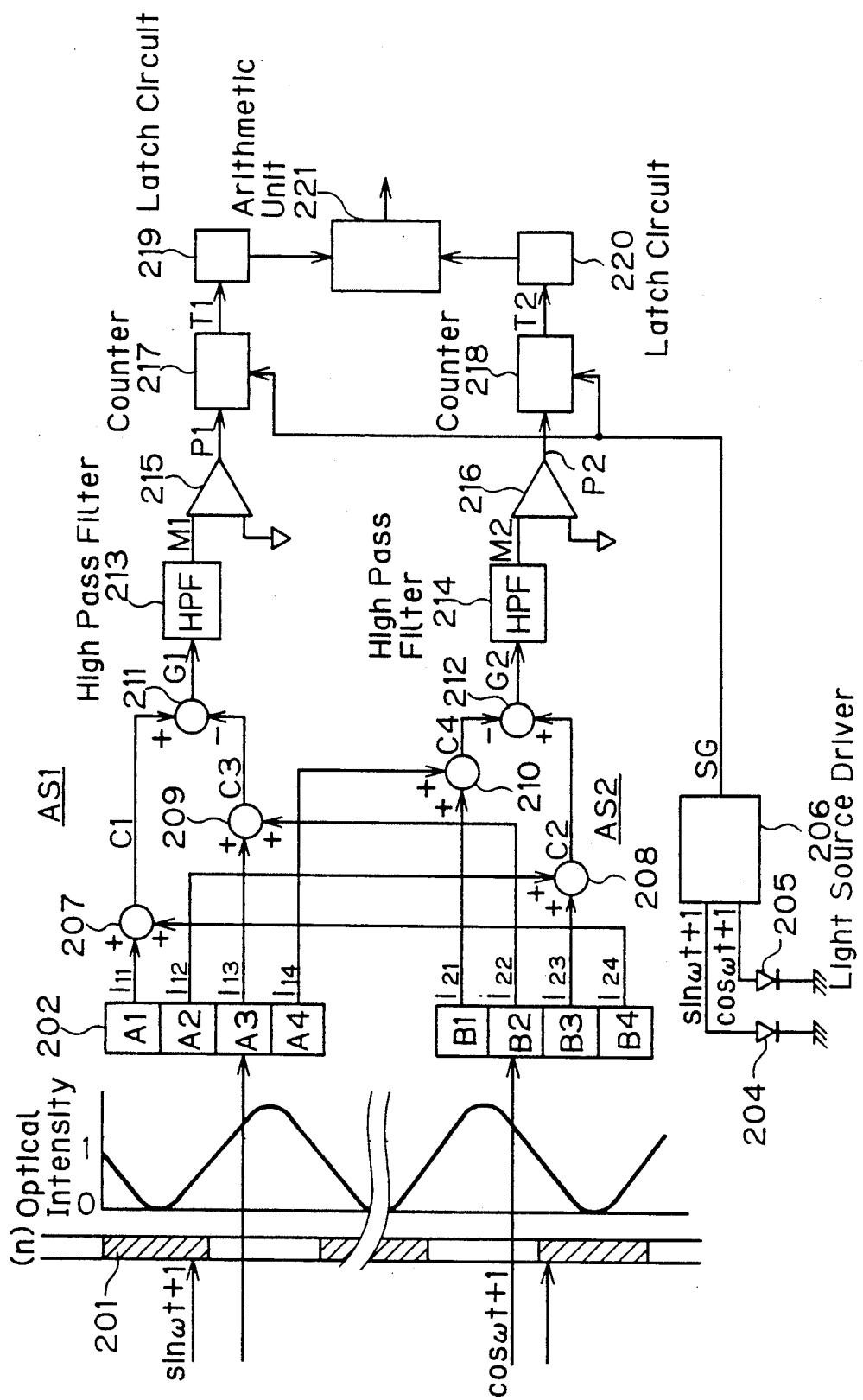
FIGS 11, 12 and 13 are diagrams depicting circuits used in the shaft angle encoder.

FIGS. 11, 12, 13, and 14 are diagrams, which taken together, show an illustrative shaft angle encoder 200 usable in the multi-turn absolute encoder of the invention. FIG. 11 shows a circuit for measuring the turning angle of code plate 201 by using one slit train (e.g. the number of slits in set at n) of two slit trains each having a different number of slits cut in code plate 201. Referring to FIG. 11, the symbol ST1 represents a slit train wherein the number of slits formed in code plate 201 is n. The circuit comprises light receiving arrays 202,203 including four light receiving elements A1-4 and Bl-Br; light sources 204,205 disposed vis-a-vis light receiving elements A1-A4 and B1-B4 through code plate 201; and a light source driving means 206 for driving light sources 204,205. The waveforms depicted to the left side in FIG. 11 are arranged such that the distribution of intensities of light passing through code plate 201 is shown as being approximately sine waves.

Figure 12:
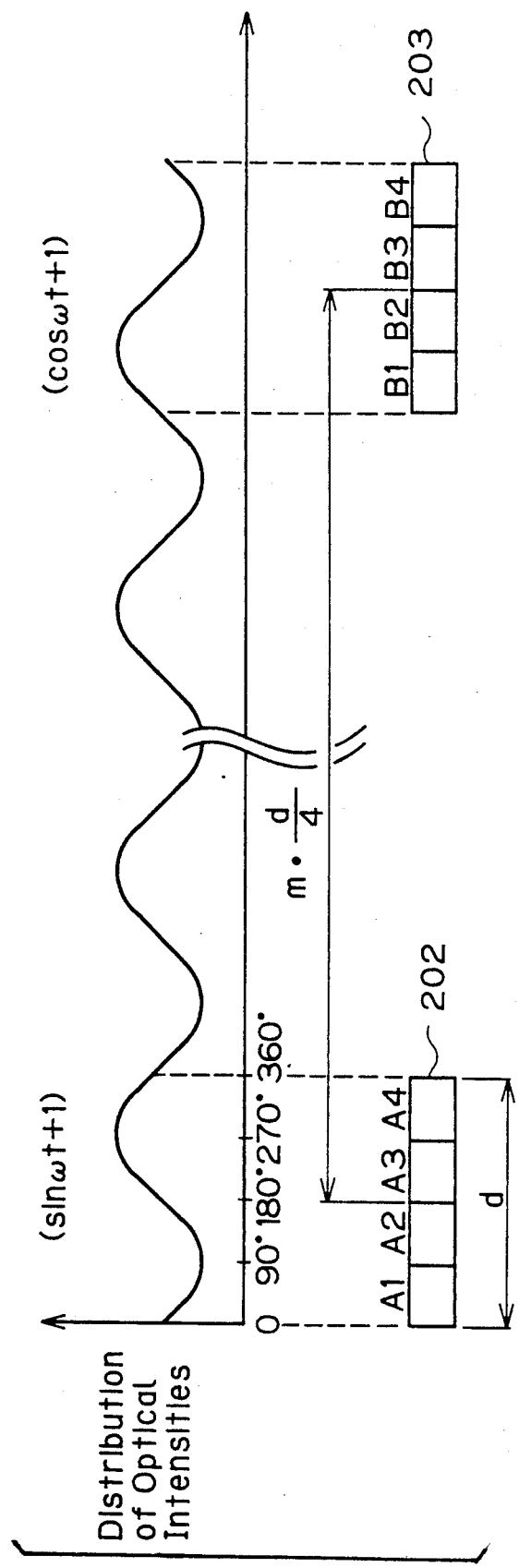

Each of light receiving elements A1-A4 and B1-B4 has a width equal to one-fourth of the light intensity distribution. Light receiving arrays 202 and 203 are, as shown in FIG. 12, disposed to have phase differences equivalent to integral multiples of 90° on the basis of the distribution of light intensities. The intensities of the beams of light emerging from the light sources 204 and 205 are amplitude modulated with $(\sin wt + 1)$ and $(\cos wt + 1)$ by means of light source driver 206. Namely, let d be one period of the light intensity distribution, and it follows that the placement thereof is made at intervals of m·d/4 in terms of space, wherein m is an integer.

Light sources 204 and 205 are disposed to exhibit an axial symmetry with respect to code plate 201. Correspondingly, light receiving array 202 is placed to receive light travelling from light source 204, while light receiving array 203 is disposed to receive light from light source 205. Note that the phase relationship between light receiving arrays 202 and 203 is kept in the foregoing manner.

Also provided are adders 207-210, and subtractors 211,212. These components are combined to constitute adder/subtractor circuits AS1 and AS2 for adding or subtracting the outputs having a predetermined phase relation to or from the outputs of light receiving elements A1-A4 and B1-B4. High pass filters 213, 214 extract signals, having a frequency component corresponding to a modulated frequency (w), from arithmetic outputs G1 and G2 outputted by the adder/subractor circuits AS1 and AS2. Comparators 215 and 216 are connected to the high pass filters 213, 214.

In the light receiving arrays 202,203, let $\phi$ be the turning angle of code plate 201. Then outputs i11–i14 and i21–i24 of light receiving elements A1-A4 and B1-B4 are expressed as follows:

$$i11 = (\sin\theta + 1)(\sin wt + 1)$$

$$i12 = (\cos\theta + 1)(\sin wt + 1)$$

$$i13 = (-\sin\theta + 1)(\sin wt + 1)$$

$$i14 = (-\cos\theta + 1)(\sin wt + 1)$$

$$i21 = (-\sin\theta + 1)(\cos wt + 1)$$

$$i22 = (-\cos\theta + 1)(\cos wt + 1)$$

$$i23 = (\sin\theta + 1)(\cos wt + 1)$$

$$i24 = (\cos\theta + 1)(\cos wt + 1)$$

The outputs G1 and G2 obtained from the adder/subtractor circuits AS1 and AS2 (subtractors 211 and 212) are expressed as follows:

$$G1 = 2\cos(wt - \theta) + 2\sqrt{2}\sin(\theta + \pi/4)$$

$$G2 = 2\sin(wt + \theta) + 2\sqrt{2}\sin(\theta + \pi/4)$$

The modulation angular frequency of light source 204 and 205 is selectively set to a higher value (de/dt<<w) than the code plate turning speed given by de/dt. Hence, from the outputs of high pass filters 213,214, there are acquired phase signals which are expressed as follows:

$$M1 = 2\cos(wt - \theta)$$

$$M2 = 2\sin(wt + \theta)$$

As can be seen from these formulae, the output signals M1 and M2 contain phase information corresponding to the turning angle $\theta$ of code plate 201. The turning angle of code plate 201 can be calculated by measuring the amount of variation in phase.

Counters 217 and 218 are provided for measuring, e.g. by counting, the amount of phase delay of comparator outputs P1 and P2 on the basis of a start pulse SG generated from light source driver 206. The circuit further comprises latch circuits 219, 220 for latching outputs T1 and T2 of counter 217 and 218; and a signal processor 221 for computing the turning angle $\theta$ of code plate 201 from the outputs T1 and T2 of counters 217 and 218.

Counting is started at the first transition of the start pulse SG which is at this time set as follows:

$$SG = 2\cos(wt).$$

Counting is finished at the last transitions of the comparator outputs P1 and P2. As a result, the outputs T1 and T2 of the counters 217 and 218 are given by $$T1 = (\pi/2) + \theta$$

$$T2 = \pi - e$$

Hence, subtraction is effected on the outputs T1 and T2 by use of signal processor 221 in accordance with the following formula T1-T2=2e-($\theta$/2). Thus, the turning angle $\theta$ of code plate 201 can be obtained within a range of $0 < \theta < 2\pi$. At this time, $2\pi$ is equivalent to one pitch of the slits.

As discussed above, the turning angle $\theta$ of code plate 201 is obtained by subtracting the phase signals M1 and M2, because these two phase signals M1 and M2, the phases of which differentially vary in accordance with the turning angle $\theta$ of code plate 201, can be acquired from the outputs of high pass filters 213 and 214. Subsequent to these operations, a signal (T1-T2) having a good S/N ratio is obtained.

If a quantity of light emerging from the light sources 204,205 varies, an amount of error due to the variations in light quantity is converted and expressed as $\theta e$. Then, phase signals M1 and M2 are given by $$M1 = 2\cos(wt - (\theta + \theta e))$$

$$M2 = 2\sin(wt + (\theta - \theta e))$$

Therefore, after the phase signals M1 and M2 have been counted by counters 217 and 218, arithmetic operations are performed by signal processor 221. The results are as follows:

$$\begin{aligned} T1 - T2 &= (e + ee) + (e - ee) - (\pi/2) \\ &= 2e - (\pi/2) \end{aligned}$$

The variations in the light quantities of the light sources 204, 205 are offset during the arithmetic operation. A positional error of the light receiving elements A1-A4 and B1-B4, of light receiving arrays 202 and 203, appears as an initial offset regardless of the turning angle $\theta$. The error is therefore, advantageously, corrected readily by signal processor 221.

Also, advantageously, since light sources 204,205 and light receiving arrays 202,203 are placed to show a substantially axial symmetry with respect to code plate 201, any eccentric influence of code plate 201 is offset.

The turning or rotary angle of code plate 201 can be accurately measured by using one slit train ST1, in the manner above described. If the other slit train ST2 having a different number of slits is used, however, the turning angle of code plate 201 can be, advantageously, absolutely measured within the range 0-2$\pi$(0°-360°).

Figure 13:
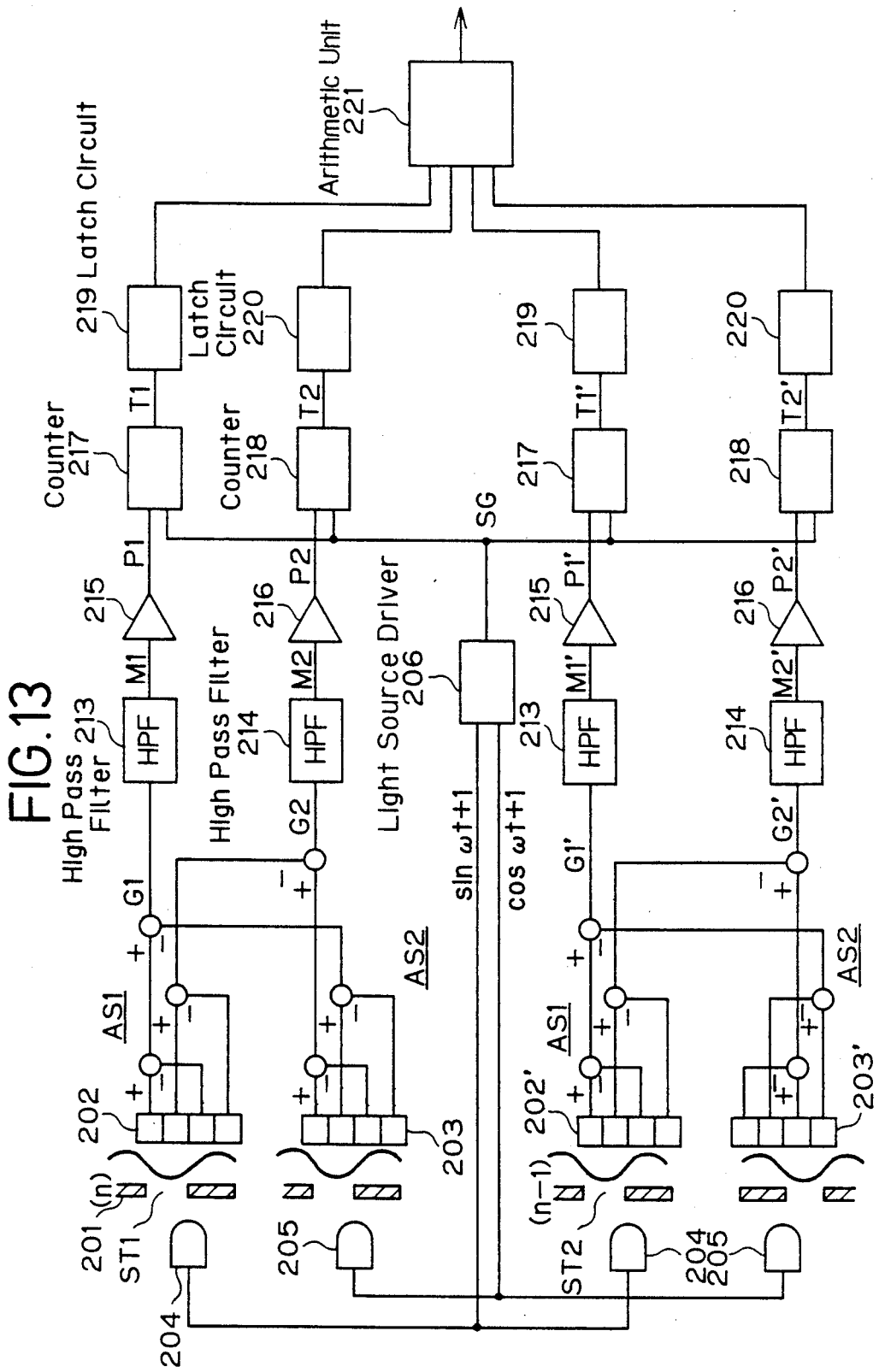

FIG. 13 depicts an arrangement for absolutely measuring the turning angle of code plate 201, wherein the same components as those shown in FIG. 11 are marked with like symbols. Code plate 201 is formed with two slit trains ST1 and ST2, each train having a different pitch. For example, the number of slits for ST1 may be n and the number of slits for ST2 may be n−1. Disposed vis-a-vis first slit train ST1 are light receiving arrays 202 and 203 used to detect the amount of displacement thereof. Light receiving arrays 202 and 203 are disposed opposite to the second slit train ST2. It is to be noted that the pitch of the light receiving elements in each of the light receiving arrays 202,203, 202' and 203' is determined according to the corresponding slit train.

Figure 14:
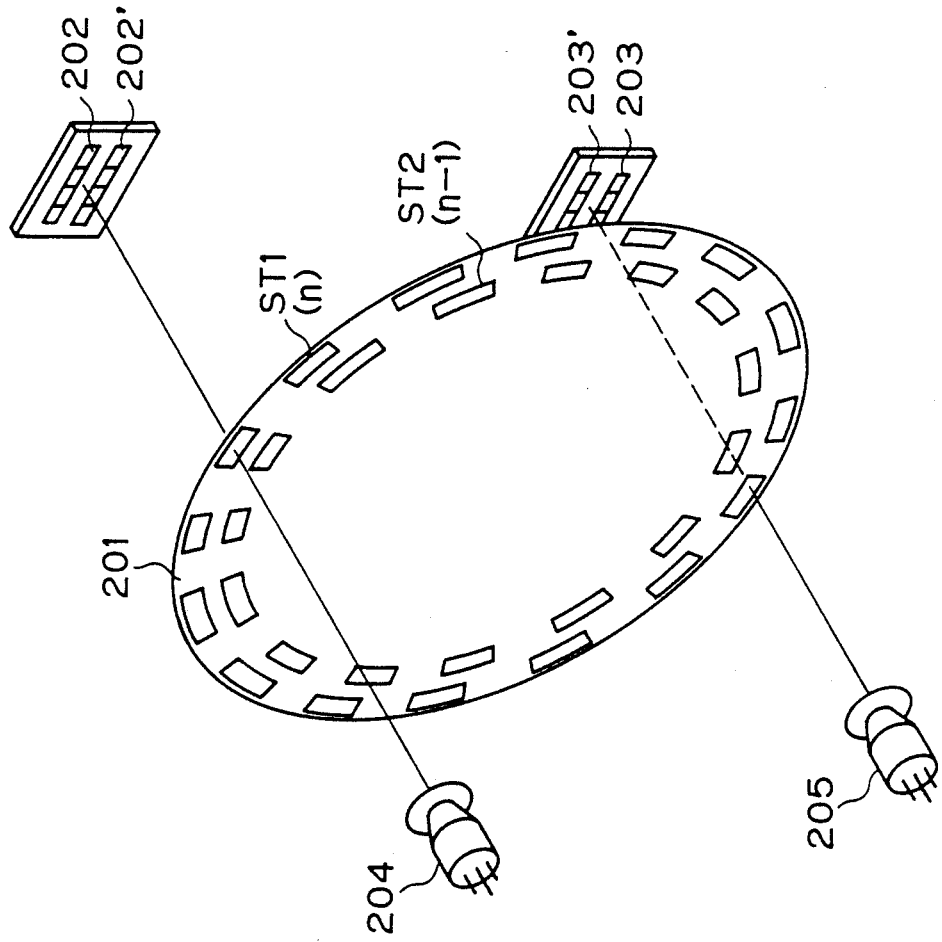
FIG. 14 is a diagram depicting relative placement of the code plate, the light sources, and the light receiving arrays.

FIG. 14 depicts the relative placement of code plate 201, light receiving arrays 202,203,202',203', and light sources 204,205. Slit trains ST1 and ST2 are disposed adjacent to each other at different radii. With this arrangement, light sources 204,205 and light source driver 206 can be used commonly in the two measuring systems.

Upon receiving the outputs from light receiving arrays 202,203, or 202',203', there are generated, for example, in the circuit of FIG. 11, phase signals T1 and T2, or T1' and T2' corresponding to the amount of displacement of each of the slit trains ST1 and ST2. The respective phase signals T1,T2,T1' and T2' are applied to signal processor 221.

As described above, when the turning angle of code plate 201 is concurrently measured by the use of the two slit trains ST1 and ST2, a Vernier's relation is established between the respective phase signals so obtained. Thus, the absolute turning angles of code plate 201 can be attained from the phase signals by arithmetic operation of signal processor 221. In the shaft angle encoder 200, the phase signals can be obtained by modulating light sources 204,205 with sine waves (sin(wt) and cos(wt) each having a different phase without using switching elements. The sine waves used for modulation at that time, however, are identical to those used for generating the second turning magnetic field, so that an oscillation circuit formed thereof can be used in common, thereby further simplifying the construction of the apparatus.

Next will be described an apparatus which was actually manufactured.

Figure 15:
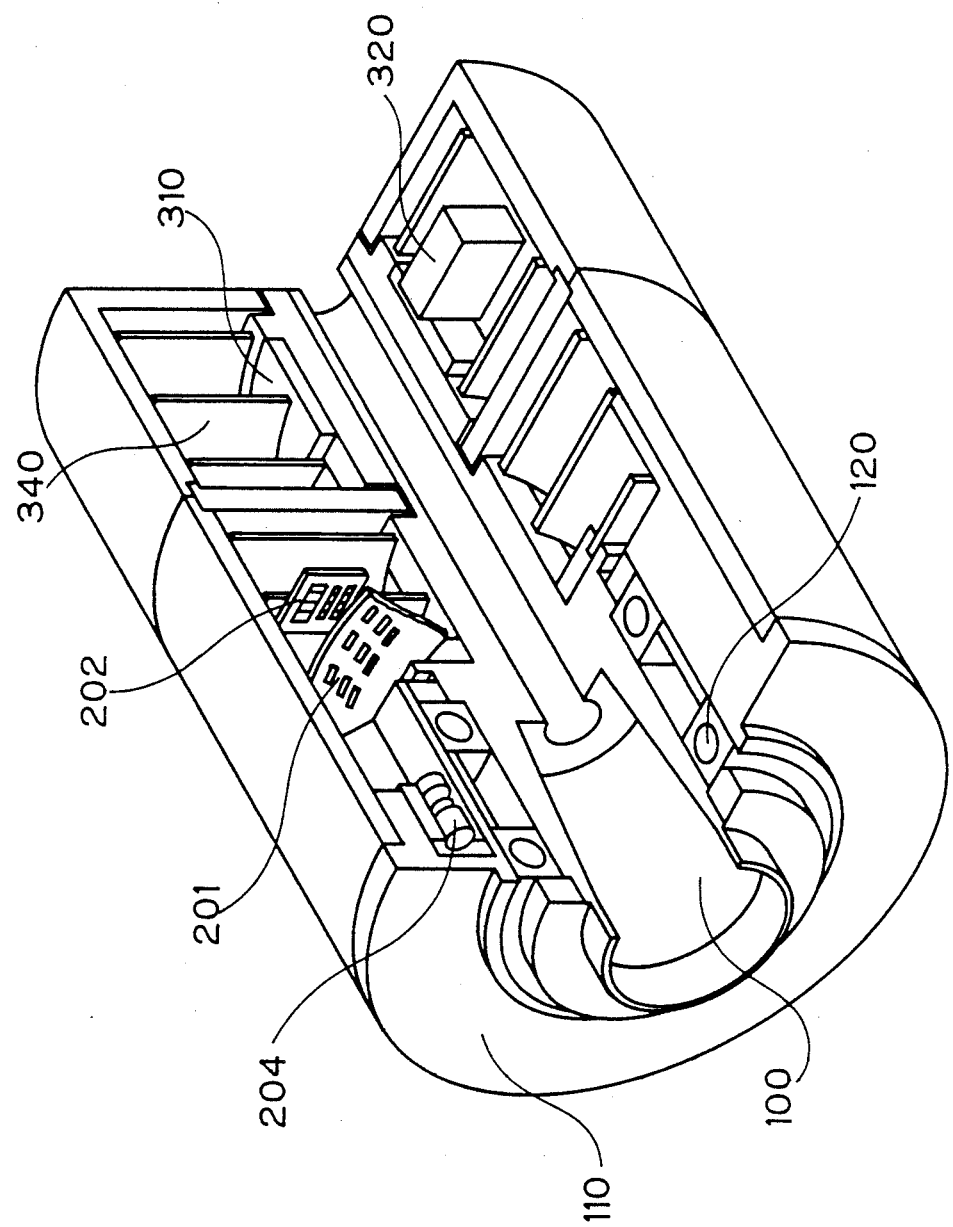
FIG. 15 is a partially cut away perspective view depicting the structure of the multi-turn absolute encoder of the invention.

In FIG. 15, fixed to rotary shaft 100 are permanent magnet 310 and code plate 201 through which light sources 204 (and 205) and light receiving arrays 202 (and 203) are disposed vis-a-vis each other. The magnetic bubble element 320 is placed on an outer periphery of permanent magnet 310 with the aid of a support substrate 340. These components are encased in a cylindrical chassis or body 110. Numeral 120 represents a bearing.

Some aspects which have not yet been discussed with respect to the operation of the invention will now be discussed. First, code plate 201 of the shaft angle encoder is formed with three trains of slits and is used for attaining very good high speed response. When measuring the turning or rotary angles of code plate 201 by utilizing the three slit trains, three phase signals having a Vernier's relation are obtained. When the number of phase signals is increased, the response to higher speeds increases. Errors due to the respective phase signals are minimized at the time of the obtaining of the absolute turning angle.

Figure 16:
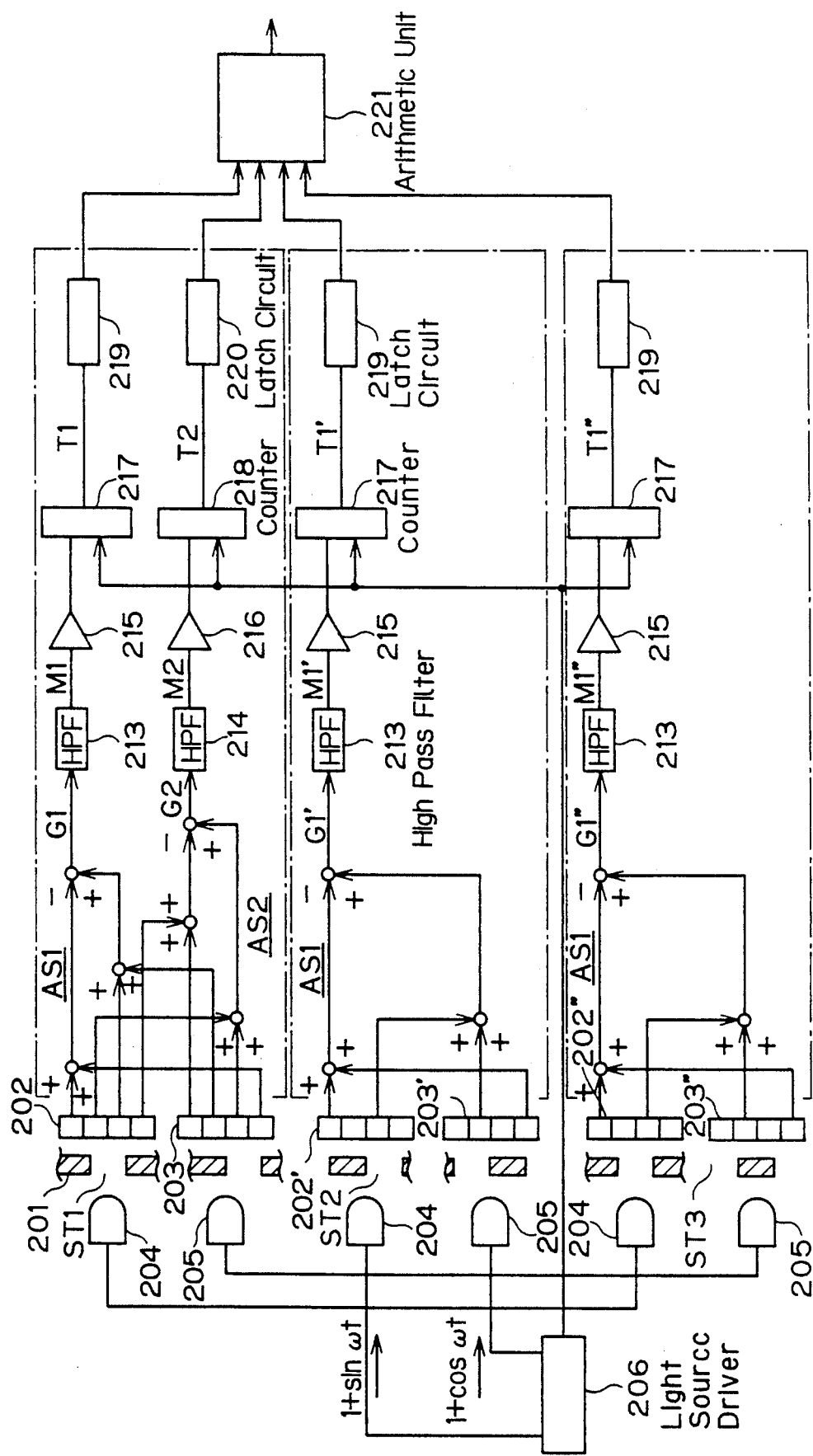
FIG. 16 is a diagram depicting an illustrative measuring circuit using three trains or series of slits.

FIG. 16 shows a circuit for measuring the turning angles using the foregoing three slit trains of FIG. 15. As discussed above, the final measurement accuracy is determined by the phase signal acquired from the first slit train ST1. On the other hand, the phase signals obtained from the second and third slit trains ST2 and ST3 are used for specifying the measurement range in the first slit train ST1,i.e., clearly recognizing the measuring point which corresponds to a specific slit amount the first slit train. The degree of high accuracy attainable using three trains of slits is not particularly required. Thus, the measuring circuit can be simplified and still attain the desired degree of accuracy For example, only one adder/subtractor circuit AS1 is used herein for the slit trains ST2 and ST3. In the case of three slit trains, it is feasible to specify the measurement range even by using such rough phase signals.

Figure 17:
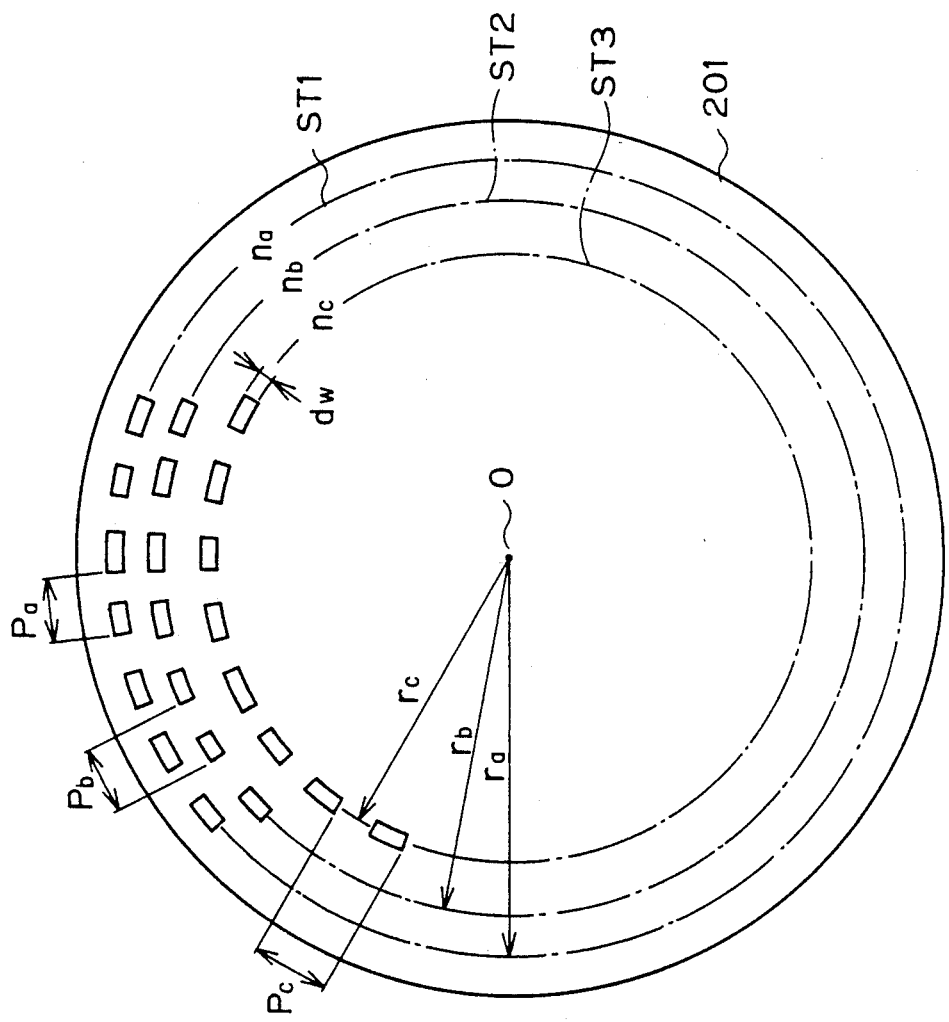
FIG. 17 is a diagram depicting an illustrative code plate.

As depicted in FIG. 17, there are given relations between the slit numbers na–nc, pitches pa–pc and radii ra–rc.

$$pa = 2\pi ra / na$$

$$pb = 2\pi rb / nb$$

$$pc = 2\pi rc / nc.$$

Based on the thus selected relations, the distribution of light intensities in the respective light receiving arrays can be given to exhibit sine waves assuming well arranged levels.

Figure 18:
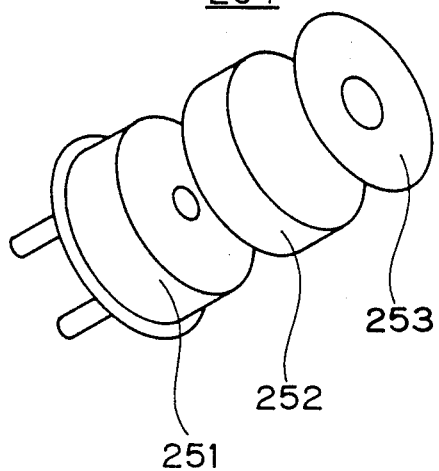
FIG. 18 is a perspective view depicting an illustrative light source.

Turning to FIG. 18, which depicts the structure of light source 204 (or 205), a diffuser plate 252 is positioned in front of a light emitting diode 251, and code plate 201 is irradiated with transmitted light via mask 253. Immediately, a sine wave like light intensity distribution having less distortion can be obtained on the corresponding light receiving array.

Figure 19:
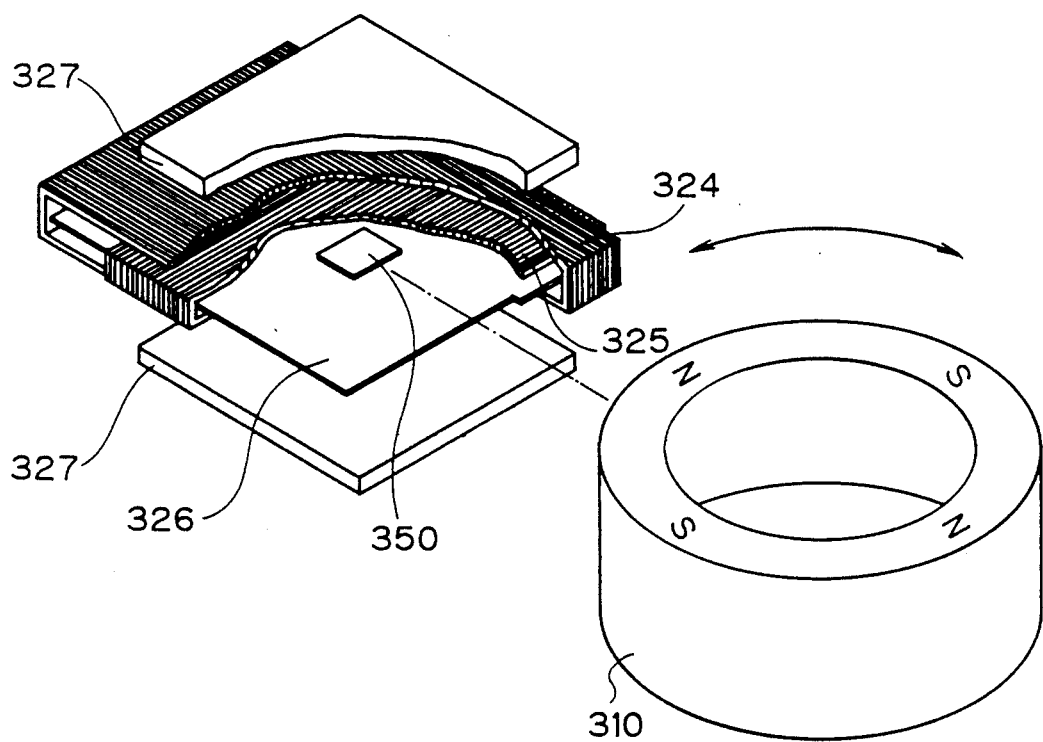
FIG. 19 is a partially cutaway perspective view depicting an illustrative magnetic bubble element.

FIG. 19 shows the structure of a magnetic bubble element 320, wherein a permanent magnet, generally indicated as 327, generates a bias magnetic field for holding the magnetic bubbles and functions to constantly apply bias magnetic field to substrate 350 and prevent values measured so far, by use of the transferred magnetic bubbles, from disappearing even when the power supply is cut off.

Figure 20:
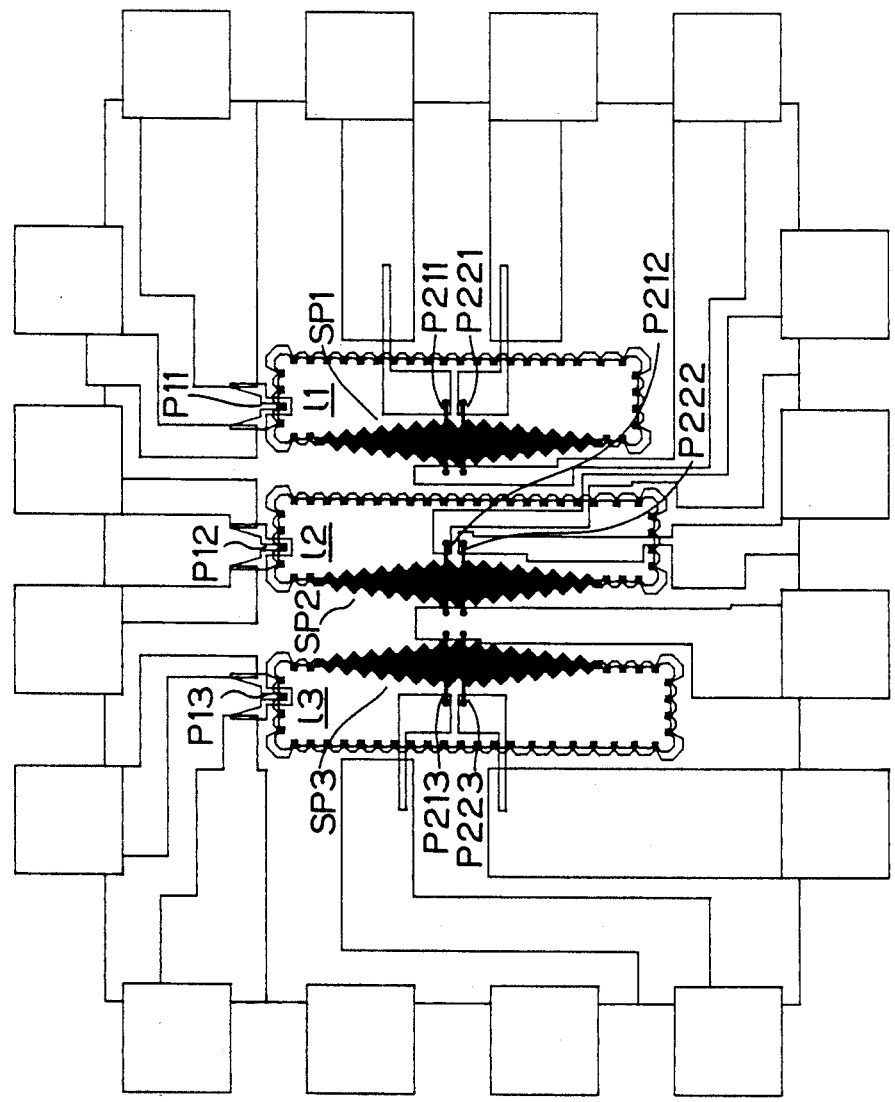
FIGS. 20 and 21 are diagrams each depicting an illustrative of a transfer pattern in the substrate.

FIG. 20 shows a transfer pattern P in substrate 350. The transfer pattern P comprises a permalloy thin film formed on a garnet film grown on the surface of a Gadlinium Gallium Garnet (GGG) wafer. The depicted transfer pattern is based on a pattern which is generally referred to as a Half-Disk.

The transfer pattern P comprises three transfer loops 11,12,13 which have integral numbers of transfer elements, e.g. 49,51,52, which numbers have no common divisor. The number of transfer loops and the number of transfer elements thereof are thus selected. Subsequent to this step, advantageously, a total of 129,948 ( calculated $49 \times 51 \times 52$) turns can be counted with 152 (calculated $49 + 51 + 52$) transfer elements.

Magnetic bubble detectors P211–P223 are aligned on a straight line, and the phases of the driving fields applied by permanent magnet 310 are equalized, thereby eliminating any mistake in detection of the number of turns. For this reason, the magnetic bubble element 320 is disposed in such a direction that the arraying direction of the magnetic bubble detectors P211–P223 coincides with the direction of a normal line of the permanent magnet 310.

Stretcher units SP1, SP2, SP3 are used for increasing the signal levels of the detection signals. If the diameter of each magnetic bubble varies due to the magnetic field of permanent magnet 310 and becomes too small, as compared with the dimensions of the transfer pattern, the transfer within the stretchers becomes unstable, with the result that the magnetic bubbles can not be detected with excellent S/N ratio.

Figure 21:
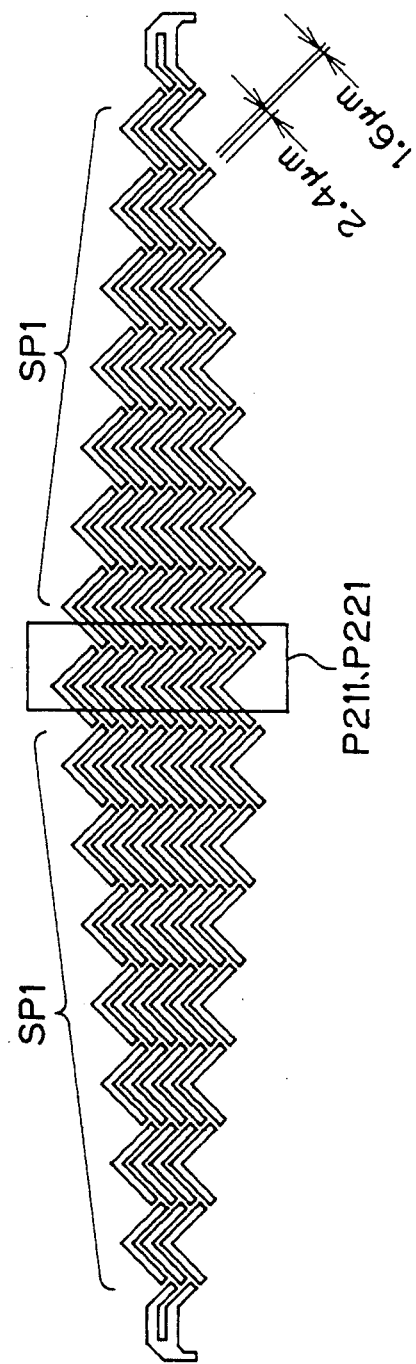

To improve this situation, as shown in FIG. 21, the diameter of the magnetic bubble is set to 4 μm when the magnetic field to be applied reaches its maximum, under which condition the least linear width of the transfer pattern is set to 60% (i.e. 2.4 μm) of the diameter thereof, and the least gap is set at 40% (i.e. 1.6 μm).

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. In a multi-turn absolute encoder comprising a turn detector for detecting number of turns of a rotary shaft and shaft angle encoder for measuring turning angle of said rotary shaft, said shaft angle encoder comprising a code plate: the improvement comprising a magnetic bubble element for sequentially transferring magnetic bubbles on a transfer pattern in accordance with a turn of a driving magnetic field; and a permanent magnet turning together with said code plate and for generating said driving magnetic field, so that said turn detector detects the number of turns of said rotary shaft from positions of said magnetic bubbles on said transfer pattern in said magnetic bubble element.

2. In a multi-turn absolute encoder comprising a turn detector for detecting number of turns of a rotary shaft and a shaft angle encoder for measuring turning angle of said rotary shaft, said shaft angle encoder comprising a code plate; the improvement comprising a magnetic bubble element for sequentially transferring magnetic bubbles on a transfer pattern in accordance with a turn of a driving magnetic field; and a permanent magnet turning together with said code plate and for generating said driving magnetic field, so that said turn detector detects the number of turns of said rotary shaft from positions of said magnetic bubbles on said transfer pattern in said magnetic bubble element;

wherein said turn detector further comprises two magnetic bubble detectors disposed corresponding to transfer elements adjacent to each other in a transfer loop comprising N transfer elements as said transfer pattern of said magnetic bubbles; a magnetic bubble transfer means for transferring said magnetic bubbles on said transfer loop independently of said permanent magnet; and a differential amplifier for obtaining a difference in output signals from said two magnetic bubble detectors; wherein a bit pattern obtained by interposing zeroes into a pattern of an n-th memory wheel which satisfies the relation $N > 2^n \geq N/2$ is written into said transfer loop depending on the presence or non-presence of said magnetic bubbles; and wherein positions of said magnetic bubbles are detected from a pattern of strains of signals generated in output signals from said differential amplifier when said magnetic bubble transfer means transfers said magnetic bubbles 2n times.

3. In a multi-turn encoder comprising a turn detector for detecting number of turns of a rotary shaft and a shaft angle encoder for measuring turning angle of said rotary shaft, said shaft angle encoder comprising a code plate; the improvement comprising a magnetic bubble element for sequentially transferring magnetic bubbles on a transfer pattern in accordance with a turn of a driving magnetic field; and a permanent magnet turning together with said code plate and for generating said driving magnetic field, so that said turn detector detects the number of turns of said rotary shaft from positions of said magnetic bubbles on said transfer pattern in said magnetic bubble element;

wherein said turn detector further comprises two magnetic bubble detectors disposed corresponding to transfer elements adjacent to each other in a plurality of transfer loops in which the number of transfer elements are two or more integers $N_1, N_2 \ldots$, which have no common divisor, said transfer loops being formed as said transfer pattern of said magnetic bubbles; a magnetic bubble transfer means for transferring said magnetic bubbles on said respective transfer loops independently of said permanent magnet; and a differential amplifier for obtaining a difference in output from said two magnetic bubble detectors; wherein a bit pattern obtained by interposing zeroes into a pattern of an ni-th memory wheel which satisfies the relation $Ni > 2^n \geq Ni/2$, wherein $i = 1, 2, \ldots$, is written into each of said transfer loops depending on presence or non-presence of said magnetic bubbles; and wherein the number of turns of said rotary shaft is obtained from a combination of patterns of series of signals generated in outputs from said differential amplifier when said magnetic bubble transfer means transfers said magnetic bubbles 2nm times when the maximum value of $n, n_2 \ldots$, is nm.

4. The encoder of claim 3, wherein said magnetic bubble detectors are aligned on a straight line, and said magnetic bubble element is disposed so that the arraying direction thereof coincides with the direction of a normal line of said permanent magnet.

5. The encoder of claim 1, wherein said shaft angle encoder comprises means for generating phase signals by measuring turning angles of said rotary shaft using slits in said code plate; and means for calculating said turning angles from a relation between phases of said plurality of phase signals obtained through use of said slits.

6. The encoder of claim 2, wherein said code plate has formed therein a plurality of trains of slits; and wherein said means for generating phase signals generates pairs of phase signals which differentially vary in accordance with said turning angles of said code plate, and comprises first and second light sources disposed in substantially axial symmetric positions in a peripheral direction of said code plate and having their light intensities which are amplitude modulated with $(\sin wt + 1)$ and $(\cos wt + 1)$ with respect to each slit train; first and second light receiving arrays, each comprising four light receiving elements each having a width which is one-fourth of one period of a distribution of said light intensities, for independently receiving beams of light emerging from said light sources through said code plate and disposed to have phase differences equivalent to integral multiples of 90° on the basis of said distribution of said light intensities; first and second adder/subtracter circuits for adding or subtracting outputs to or from each other which have a predetermined phase relation from the outputs of said respective elements in combination constituting said first and second light receiving arrays; and first and second high pass filters for extracting said phase signals having frequency components corresponding to said modulated frequencies of said first and second light sources from the outputs of said first and second adder/subtracter circuits.

7. The encoder of claim 6, wherein said code plate is formed with three slit trains, and relations between slit numbers na–nc, pitches pa–pc, and radii ra–rc, in said respective slit trains are as follows: $pa = 2\pi ra/na$; $pb = 2\pi rb/nb$; and $pc = 2\pi rc/nc$.

8. The encoder of claim 2, wherein said shaft angle encoder comprises means for generating phase signals by measuring turning angles of said rotary shaft using slits in said code plate; and means for calculating said turning angles from a relation between phases of said plurality of phase signals obtained through use of said slits.

9. The encoder of claim 3, wherein said shaft angle encoder comprises means for generating phase signals by measuring turning angles of said rotary shaft using slits in said code plate; and means for calculating said turning angles from a relation between phases of said plurality of phase signals obtained through use of said slits.

10. The encoder of claim 3, wherein said code plate has formed therein a plurality of trains of slits; and wherein said means for generating phase signals generates pairs of phase signals which differentially vary in accordance with said turning angles of said code plate, and comprises first and second light sources disposed in substantially axial symmetric positions in a peripheral direction of said code plate and having their light intensities which are amplitude modulated with $(\sin(wt)+1)$ and $(\cos(wt)+1)$ with respect to each slit train; first and second light receiving arrays, each comprising four light receiving elements each having a width which is one-fourth of one period of a distribution of said light intensities, for independently receiving beams of light emerging from said light sources through said code plate and disposed to have phase differences equivalent to integral multiples of 90° on the basis of said distribution of said light intensities; first and second adder/subtractor circuits for adding or subtracting outputs to or from each other which have a predetermined phase relation from the outputs of said respective elements in combination constituting said first and second light receiving arrays; and first and second high pass filters for extracting said phase signals having frequency components corresponding to said modulated frequencies of said first and second light sources from the outputs of said first and second adder/subtractor circuits.

11. The encoder of claim 10, wherein said code plate is formed with three slit trains, and relations between slit numbers na–nc, pitches pa–pc, and radii ra–rc, in said respective slit trains are as follows; $pa=2\pi ra/na$; $pb=2\pi rb/nb$; and $pc=2\pi rc/nc$.

* * * * *